US012345371B2

(12) United States Patent
Dutta et al.

(10) Patent No.: US 12,345,371 B2
(45) Date of Patent: Jul. 1, 2025

(54) THREE DEGREES OF FREEDOM (3DoFs) PRECISION POSITIONING WEDGE AIR BEARING STAGE SYSTEM (WABSS)

(71) Applicant: COUNCIL OF SCIENTIFIC AND INDUSTRIAL RESEARCH, New Delhi (IN)

(72) Inventors: Samik Dutta, Durgapur (IN); Abhijit Mahapatra, Durgapur (IN); Kornel F. Ehmann, Evanston, IL (US)

(73) Assignee: Council of Scientific and Industrial Research, New Delhi (IN)

( * ) Notice: Subject to any disclaimer, the term of this patent is extended or adjusted under 35 U.S.C. 154(b) by 0 days.

(21) Appl. No.: 18/426,906

(22) Filed: Jan. 30, 2024

(65) Prior Publication Data
US 2024/0255096 A1  Aug. 1, 2024

(30) Foreign Application Priority Data
Jan. 31, 2023 (IN) .............................. 202311006418

(51) Int. Cl.
*F16M 11/20* (2006.01)
*F16C 32/06* (2006.01)

(52) U.S. Cl.
CPC ..... *F16M 11/2042* (2013.01); *F16C 32/0622* (2013.01)

(58) Field of Classification Search
CPC .................. F16M 11/2042; F16C 32/0622
See application file for complete search history.

(56) References Cited

U.S. PATENT DOCUMENTS

| 4,776,696 | A | * | 10/1988 | Hettrick | .................... | G01J 3/18 |
| | | | | | | 359/569 |
| 5,354,158 | A | | 10/1994 | Sheldon et al. | | |
| 5,901,936 | A | | 5/1999 | Bieg | | |
| 6,330,837 | B1 | | 12/2001 | Charles et al. | | |
| 6,477,912 | B2 | | 11/2002 | Song et al. | | |
| 6,575,676 | B2 | | 6/2003 | Wang et al. | | |
| 6,769,194 | B2 | | 8/2004 | Hennessey | | |
| 7,673,384 | B2 | | 3/2010 | O'Connell et al. | | |

(Continued)

FOREIGN PATENT DOCUMENTS

| DE | 102012000989 A1 | 7/2013 |
| WO | WO 2018/158120 A1 | 9/2018 |

*Primary Examiner* — Eret C McNichols
(74) *Attorney, Agent, or Firm* — Knobbe Martens Olson & Bear LLP

(57) ABSTRACT

A three degrees of freedom (3DoFs) Wedge Air Bearing Translational Stage System (WABSS) for positioning of miniature components using a parallel kinematic mechanism. The system has three kinematic sub-chains situated at 120° apart from each other, where each sub-chain has one prismatic joint and one planar joint guided by air bearings. One central stage assembly (CSA) having three wedges with wedge planes oriented 45° to the horizontal plane is capable of translations along the X-, Y- and Z-axes for precision positioning of the targeted workpiece material held on the CSA. Following the parallel kinematic principle, the coordinated translations of the three slide bars produce 3DoFs translations to position CSA in each sub-chain. The linear geometric error along the Z-axis is independent from the angular tolerances due to its unique vertical structure.

9 Claims, 8 Drawing Sheets

(56) References Cited

U.S. PATENT DOCUMENTS

| | | | |
|---|---|---|---|
| 8,215,199 B2 | 7/2012 | Marcroft et al. | |
| 9,545,697 B2 * | 1/2017 | Whinnem | B23Q 9/0014 |
| 9,694,455 B2 | 7/2017 | Brown et al. | |
| 10,663,040 B2 | 5/2020 | Shu et al. | |
| 10,830,582 B2 * | 11/2020 | Durand | G01B 21/042 |
| 11,484,979 B2 * | 11/2022 | Brown | B25J 9/0045 |
| 2010/0139436 A1 * | 6/2010 | Kawashima | B25J 17/0266 |
| | | | 700/260 |
| 2012/0323345 A1 * | 12/2012 | Jonas | G01B 21/045 |
| | | | 700/57 |
| 2013/0061710 A1 * | 3/2013 | Long | B25J 17/0275 |
| | | | 403/132 |
| 2014/0263883 A1 * | 9/2014 | Rushworth | B25J 17/0216 |
| | | | 248/163.1 |
| 2014/0331806 A1 * | 11/2014 | Nagatsuka | B25J 18/00 |
| | | | 901/19 |

* cited by examiner

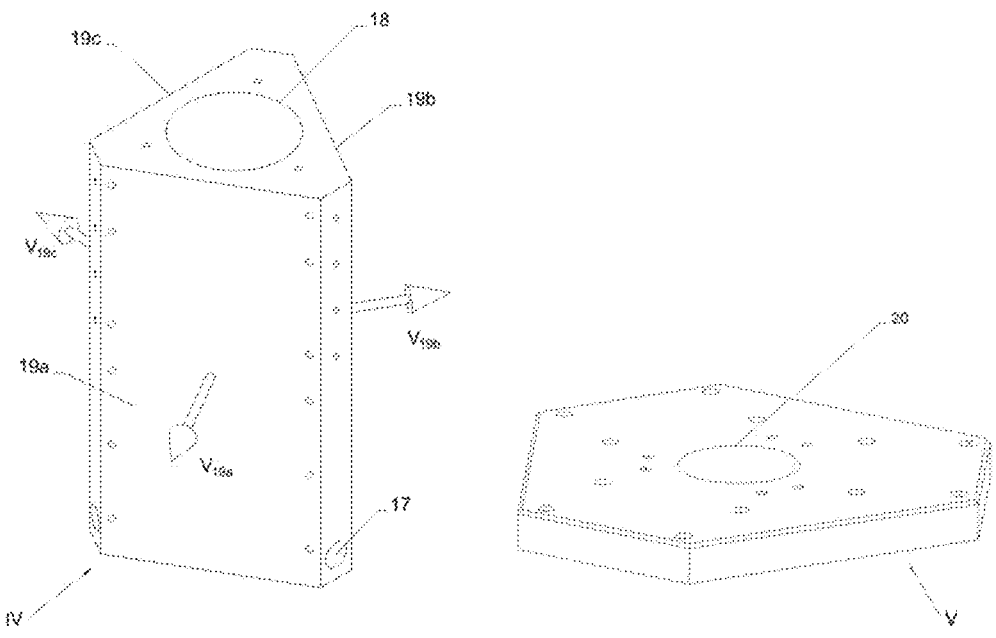
FIGURE 6
FIGURE 7
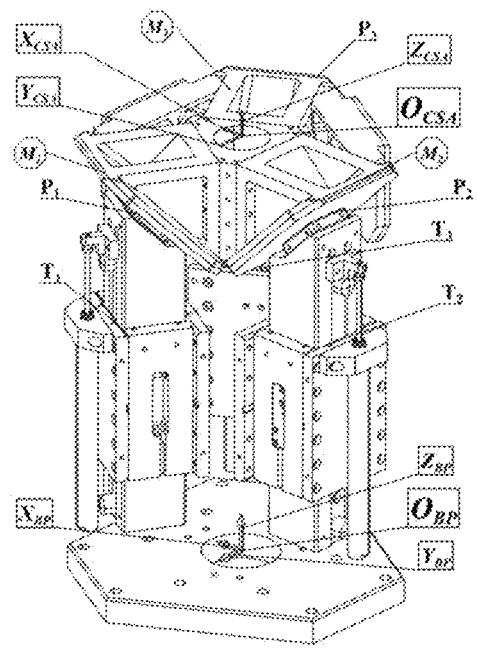
FIGURE 8

THREE DEGREES OF FREEDOM (3DoFs) PRECISION POSITIONING WEDGE AIR BEARING STAGE SYSTEM (WABSS)

FIELD OF INVENTION

The present invention relates to a three degrees of freedom (3DoFs) precision positioning Wedge Air Bearing Stage System (WABSS). In the present invention, a movable central stage assembly (CSA) is connected with a stationary base platform (BP) via three slide bar assemblies (SBAs) spaced apart 120° from each other. CSA is able to translate along X-, Y- and Z-axes, by constraining the rotation via a coordinated and synchronous motion through the three kinematic sub-chains arranged in parallel.

The present invention particularly relates to a device with 3DoFs precision positioning capability that works on parallel kinematics principles by using three SBAs, where each of the SBAs is actuated by a permanent magnet linear motor through electromagnetic actuation. The combination of the motions of these three SBAs produces a 3DoFs output at the CSA. Subsequently, the CSA produces a movement along the X-, Y- and Z-axes with comparatively long travel ranges for high precision positioning of a component placed over it. The CSA embodies a metrology system for real-time geometric and kinematic error calibration and compensation.

BACKGROUND AND PRIOR ART OF INVENTION

Reference may be made to U.S. Pat. No. 6,769,194 B2 wherein a system and process for positioning of components with sub-micron level precision with a parallel kinematic based manipulation system was disclosed, where three or six slide assemblies were utilized to obtain three or six degrees of freedom translations, respectively, in a movable platform or end effector. The drawbacks are the presence of a greater number of passive joints (two universal or spherical joints) connected serially with the active prismatic joint in each kinematic sub-chain resulting in more cumulative errors; absence of frictionless passive joints resulting in more thermal distortions; and the presence of linear piezoelectric actuators resulting limited translation, thereby restricting it to a smaller workspace volume at the movable platform.

Reference may be made to U.S. Pat. No. 8,215,199B2 wherein a six-degrees of freedom parallel kinematics-based positioning system having six kinematic sub-chains has been disclosed, where a linear servo motor driven prismatic joint was used as active or actuated joint along with two universal joints (lower and upper) as passive joints in each of the kinematic sub-chains. The drawbacks are the presence of a greater number of passive joints (two universal joints) connected serially with the active prismatic joint in each kinematic sub-chain resulting in more cumulative errors; absence of frictionless passive joints resulting in more thermal distortions; and more linear geometric errors from Z-axis translation due to its structural topology limits the workspace volume.

Reference may be made to U.S. Pat. No. 9,694,455B2 wherein a six-degrees of freedom parallel kinematics-based positioning system having two passive joints and one active joint with pneumatic counterbalance in each kinematic sub-chain. The drawbacks are the presence of a greater number of passive joints and friction at the passive joints to limit the precision of the system.

Reference may also be made to U.S. Pat. Nos. 6,477,912 B2, 6,575,676 B2, W.O. patent no. 2018/158120 AI, U.S. Pat. Nos. 5,354,158A, 10,663,040 B2, 5,901,936, 6,330,837 B1, 7,673,384 B2, D.E. patent no. 102012000989 A1 wherein the major limitations of the parallel kinematics-based positioning systems are the presence of a large number of passive joints in each kinematic sub-chain and the absence of frictionless passive joints which limits the precision and dynamic stability for comparatively large workspace volumes.

Based on the prior art details and drawbacks thereof outlined to the conclusion that there is no exclusive system for high precision positioning of components in larger than a 47 mm×47 mm×47 mm rhombohedral workspace volume, with nanometer level resolution. Further there is no such parallel kinematic based positioning system available with only one passive joint in each kinematic sub-chain to reduce the cumulative error. Also, in any of the existing systems shown in prior art, the linear geometric or position errors along the Z-axis caused by geometric and assembly tolerances are dependent on the angular or orientation tolerances, due to which the Z-axis displacement is limited in terms of high precision positioning. Provisions for Abbe error independent measurements of the end-effector's translation are also not present in the systems in the prior art. In principle, Abbe error free measurement is required to enhance the precision level of the system from high to ultra-high accuracy by performing real-time kinematic calibrations and compensation of the system using high resolution (may be in the sub-nm resolution range) plane mirrors and laser interferometers. Therefore, providing the option for Abbe error free measurement should be highly emphasized for the positioning stage to achieve ultra-high precision positioning. The foot prints of the existing systems require larger dimensions for achieving the same workspace volume due to the absence of a vertical structural topology, which is resulting in more thermal and geometric errors. Therefore, the present invention can overcome one or more drawbacks of the existing 3DoFs translational stages (both conventional and non-conventional).

OBJECTIVES

The main object of the present invention is to provide a three degrees of freedom (3DoFs) precision positioning wedge air bearing stage system (WABSS) which obviates the drawbacks of the hitherto known prior art as detailed above.

Another object of the present invention is to provide a 3DoFs precision positioning WABSS which will only have three kinematic sub-chains spaced apart by 120° with respect to each other for obtaining a symmetric kinematic coupling between the stationary BP and movable CSA.

Still another object of the present invention is to provide a connection between the stationary BP and the movable CSA with the help of one vertical carriage column (CC), three carriage assemblies (CAs) and three SBAs, where each of the SBAs has one prismatic joint with the corresponding CAs and one planar joint with the corresponding wedge planes of the CSA to connect the stationary BP with the movable CSA.

Yet another object of the present invention is to provide a minimum number of joints, that is, one prismatic joint and one planar joint only, which are connected serially in each kinematic sub-chain for achieving minimum cumulative errors due to the presence of a smaller number of joints.

Yet another object of the present invention is to provide a wedge-shaped CSA, where three wedge planes (arranged at 45° with the horizontal plane or XY-plane) are spaced apart by 120° with respect to each other to provide only the three translations along the X-, Y- and Z-axes of the CSA by constraining all the rotations.

Yet another object of the present invention is to provide a frictionless motion with minimum thermal distortion in the system by the use of air bearings in each of the active prismatic and passive planar joints.

Yet another object of the present invention is to provide an ironless permanent magnet linear motor in each of the active prismatic joints, which can ensure a smooth movement with no cogging.

Yet another object of the present invention is to provide a pneumatic counterbalance system with each of the active prismatic joints for compensating the gravity at the time of actuation of the joints, for quick settling or less dynamic disturbance and to protect the system from unforeseen circumstances due to sudden power off situation.

Yet another object of the present invention is to provide feedback on translation of each of the SBAs through a high resolution (2 nanometer) linear optical encoder, where the glass scale is attached to the SBA and the reading head is attached to the corresponding stationary carriage, for subsequent motion control of the corresponding linear motor.

Yet another object of the present invention is to provide a geometric error model for the 3DoFs XYZ positioning WABSS.

Yet another object of the present invention is to provide a unique structural topology, so that the geometric error along the Z-axis induced due to kinematic constraints of the CSA are independent of angular tolerances of the system.

Yet another object of the present invention is to provide a compact, robust, relatively smaller stage system (including foot print) so as to ensure minimal error values.

Yet another object of the present invention is to provide a metrology system consisting of plane mirrors arranged in such a way that the laser beams from respective laser interferometers can be aligned with the axes of translations of the CSA for measurement of the translations or pose of the CSA and real-time geometric and kinematic calibration for subsequent error compensation by correcting the kinematic parameters in the kinematic equations on the fly to enhance the precision of positioning via ensuring Abbe error free measurement of the translations or pose or position of the movable CSA.

The present invention provides a 3DoFs WABSS for precision positioning of miniature components using parallel kinematic principle. The system has three kinematic sub-chains, 120° apart from each other, where each sub-chain has a prismatic and a planar joint, guided by air bearings to make them frictionless for smooth motion. One CSA consisting of three wedges with wedge planes oriented at 45° to the horizontal plane is capable of translating only along Cartesian X-, Y- and Z-axes for positioning and the targeted workpiece material can be held on the CSA. The CSA is connected to a stationary BP via three SBAs, three CAs, and one vertical CC. Each of the prismatic joints is formed between the corresponding SBA and CA. Each of the planar joints is formed between the corresponding wedge plane of the CSA and the flat pad air bearing present at the top of the respective SBA. One pneumatic counterbalance system is provided with each prismatic joint for gravity compensation, for quick settling and for protection from sudden power off situation. Following kinematic principles, the coordinated translations of the three slide bars in the SBAs can be achieved (via one single DoF prismatic joint and one two DoFs planar joint in each sub-chain), which produces a 3DoFs (along X-, Y- and Z-axis) translations for positioning of the CSA. Prismatic joints are actuated by iron-less linear motors and their motion control is performed from the feedback obtained through the corresponding optical linear encoders. The linear geometric error along the Z-axis is independent of the angular tolerances due to the unique structural topology of the 3DoFs WABSS. Also, the particular vertical topology of the WABSS structure is responsible for less foot print for reduced geometric and thermal errors for high precision positioning. Due to the wedge-shaped structure of the CSA, the system is free from any rotation. Also, the three plane mirrors attached to the wedge column of the CSA are arranged in such a way that an Abbe error free measurement of the position of the CSA through high resolution laser beam interferometers is possible for further errors compensation by real-time kinematic calibration.

The novelties of the present invention are due to its, (1) independence of the geometric error along the Z-axis from the angular tolerances during kinematic calibration as a consequence of the novel and unique vertical topological design, (2) reduced thermal and geometric errors due to a small foot-print for its unique vertical structure, and (3) Abbe error free design for further kinematic calibration, thereby, making 3DoFs WABSS a high precision positioning system.

The non-obvious inventive steps of the present invention rest in (1) the unique mechanical design of the 3DoFs WABSS comprising of a wedge-shaped CSA (I) that executes movement based on a parallel kinematic mechanism by constraining its three rotational motions and allowing only three pure translational motions in the X-, Y- and Z-axes respectively, for high precision positioning, (2) the CSA (I) being kinematically linked to three kinematic sub-chains, thereby, forming three closed loops with a minimum number of joints, that is, one prismatic (presence of a direct drive linear motor with pneumatic counterbalance that is responsible for gravity or weight compensation and protection from sudden power cut) and one planar joint in each kinematic sub-chain, both guided by aerostatic bearings for smooth motion, subsequently leading to reduction in the cumulative errors and inducing of high efficiency translation, high stiffness, for precision positioning, (3) independency of the geometric error along the Z-axis ($\delta z$) from angular tolerances due to the unique wedge-shaped vertical structure of the 3DoFs WABSS, that is, increased range of Z-axis translation resulting in increased workspace volume without compromising on the level of precision, (4) collinearity between the axis of motion of the 3DoFs WABSS with fixed plane mirrors on the wedges of the CSA (I) and the axis of measurement of the laser interferometers, during kinematic calibration leading to a Abbe error free system, within the limit of the present specifications. These constructional features and associated mechanisms are identified as the non-obvious inventive steps in the system of the present invention.

The following examples are given by way of illustration of the working of the invention in actual practice and therefore should not be construed to limit the scope of the present invention.

DETAILED DESCRIPTION OF DRAWINGS

The present invention is illustrated in FIGS. 1 to 11 of the drawing(s) accompanying this specification. In the drawings like reference numbers/letters indicate the corresponding parts in various figures.

FIG. 1 represents an isometric view of the 3 DoFs WABSS of the present invention which comprises of the following: CSA designated by 'I', SBA designated by 'II', CA designated by 'III', vertical CC designated by 'IV' and stationary BP designated by 'V'. In this system, movable CSA (I) is enabled to float on the flat pad air bearings of the corresponding three SBAs (II) forming planar joints. Three SBAs (II) are placed into the corresponding CAs (III) to build prismatic joints. All three SBAs (II) and three CAs (III), present in this system, are positioned symmetrically at 120° apart from each other via three side walls of a centrally located fixed vertical CC (IV) and subsequently the CC (IV) is attached on the stationary BP (V).

FIGS. 2A and 2B represent the isometric and exploded views, respectively, of the CSA (I) comprising five major components (1 to 5) as described below:

The three wedges, 2a, 2b and 2c are attached to the side walls, 1a, 1b and 1c, respectively, of wedge column (1) with the help of precision screws, as represented in FIG. 2A. $V_{1a}$, $V_{1b}$ and $V_{1c}$ are three axes vertical to the planes of the side walls, 1a, 1b and 1c, respectively, where the angles between $V_{1a}$ and $V_{1b}$, $V_{1b}$ and $V_{1c}$, $V_{1c}$ and $V_{1a}$ are at 120° in the horizontal plane, as represented in FIG. 2B. Thus, the wedges, 2a, 2b and 2c make a symmetric configuration. Three plates (3a, 3b and 3c) made of stainless-steel material are attached to the corresponding wedges (2a, 2b, and 2c) to facilitate the magnetic pre-loading for flat pad air bearings of the planar joints to maintain the required stiffness. Provision of two mirror mounts (4a and 4b) along with plane mirrors, 5a and 5b is present for the kinematic calibration of the CSA (I) by using a high precision plane mirror laser interferometer system to compensate errors at the time of positioning. Mirror mount brackets (6a and 6b), as represented in FIG. 2B, are attached to 4a and 4b, respectively, for holding the mirror mounts. The mirror mount brackets, 6a and 6b, are attached to the side walls, 1d and 1e, respectively, of wedge column (1). Mirror mount (4c) is attached to the bottom surface (1f) of the wedge column (1) using precision screws, on which a plane mirror (5c) is attached, as represented in FIG. 2B. The plane mirror (4c) is present as a provision for kinematic calibration of CSA (I) along the Z-axis displacement.

FIGS. 3A and 3B represent isometric views (front and back side, respectively) of each SBA (II) of the present invention which comprises of six major components (7 to 12) that are described as follows:

A slide bar (8) is provided with which optical scale (7) of the optical linear encoder, magnetic pre-loaded flat pad air bearing (9), magnetic track (10) of the ironless linear motor, piston (11a) and its mount (11b) of the pneumatic counterbalance system, limit stoppers (12a and 12b) and are attached. The magnetic pre-loaded flat pad air bearing (9), present at the top of the slide bar (8), is provided to bear the CSA (I) at three planar joints with magnetic pre-loading. The magnetic track of the linear motor (10) is placed inside a slot of the slide bar (8) to ensure its translation through energizing of the corresponding motor coil. The synchronous translations of the three SBAs (II), following proper kinematic principle ensures the desired positioning of the CSA (I) via the planar joints between the flat pad air bearing (9) and the corresponding planes of the stainless-steel plates (3a, 3b and 3c) attached with the wedges (2a, 2b and 2c) of CSA (I). Piston (11a) and piston mounts (11b) are attached to the slide bar (8) for the pneumatic counterbalance system. Upper and lower limit mechanical stoppers (12a and 12b) are present for restricting the translations within a limit for protection purposes. The main function of the three SBAs (II) is to move the CSA (I) by coordinated translations of slide bars (8) along the Z-axis.

FIG. 4 represents the exploded view of the magnetic preloaded flat pad air bearing (9) of the present invention which, present at each planar joint, comprises of the following parts:

Magnetic preloaded flat pad air bearing (9a) angular base, cylindrical magnet (9b), block magnet holder (9c), block magnet (9d) for magnetic preloading, flat pad air bearing plate (9e) and an air pressure line (9f) are present in the flat pad air bearing sub-assembly (9). The main function of this sub-assembly is to create frictionless planar joints between the SBAs (II) with the corresponding stainless-steel plates (3a, 3b and 3c) attached with the wedges (2a, 2b and 2c) of CSA (I) through air bearings with magnetic pre-loading.

FIGS. 5A, 5B and 5C represent the isometric views from the rear angle, front angle and the exploded view, respectively, of each CA (III) of the present invention, which comprises of the following parts:

Linear air bearing (13) consisting of four linear air bearing plates (13a, 13b, 13c and 13d) and an air pressure line (13e) are the major parts of the CA (III). Other than these, cylinder (14a), corresponding mounting bracket (14b) and pneumatic air pressure line (14c) of the pneumatic counterbalance system, reading head (15b), corresponding signal cable (15c) of the optical linear encoder and the corresponding mount (15a), three-phase coil (16a), corresponding cable for carrying electric current (16b) and Hall sensor cable (16c) of the ironless linear motor are attached with each CA (III). The linear air bearing plate (13a), attached to the vertical CC (IV), is carrying the motor coil (16a). Linear air bearing plates (13b and 13d) are attached to the linear air bearing plate (13a) using precision screws. A slot is provided at the linear air bearing plate (13b) for placing the mount (15a) of the optical linear encoder's reading head (15b) and to make a provision for placing the encoder's signal cable (15c). The remaining linear air bearing plate (13c) is fixed to the plates (13b and 13d) at the opposite end of plate (13a) using precision screws. A mount (14b) is also attached to the plate (13c) using screws where the cylinder (14a) of the pneumatic counterbalance is attached. An air pressure line (14c) is provided at the lower side of the cylinder (14a) to provide the required pneumatic pressure to make the pneumatic counterbalance frictionless. An air pressure line (13e) is attached to the plate (13b) for providing the required air pressure to the linear air bearing (13). The main function of each CA (III) is to make a prismatic joint with the corresponding SBA (II) through linear air bearing (13), where CA (III) is stationary and SBA (II) is movable along the Z-axis. As each of the CAs (III) is stationary, all the signal cables (15c, 16b and 16c) and the pipes or pressure lines (13e and 14c) for air flow are stationary. This avoids complex cable and pipe management.

FIG. 6 represents the isometric view of the vertical CC (IV) of the present invention, which comprises of the following components:

The major function of the CC (IV), which is placed vertically on the stationary BP (V) and is attached to the same via screws, is to create the vertical structural topology of the WABSS. Here three CAs (III) are fixed at the side walls, 19a, 19b and 19c, using precision screws and $V_{19a}$, $V_{19b}$ and $V_{19c}$ are three axes vertical to the planes of side walls, 19a, 19b and 19c, respectively, where the angles between $V_{19a}$ and $V_{19b}$, $V_{19b}$ and $V_{19c}$, $V_{19c}$ and $V_{19a}$ are at 120° with respect to the horizontal plane. Thus, the CAs (III) are stationary, vertical and make 120° with each other, so that the planar joints between the SBAs (II) and the CSA (I)

become aligned and the structure becomes vertical. A free hole (17) in the CC is provided to pass laser beams from the laser interferometer for kinematic calibration. A right-angle mirror is positioned at the center of the hole (18) for passing and subsequently deflecting the laser beams from the horizontal to the vertical direction, that is, towards the plane mirror (5c) present at the bottom of CSA (I).

FIG. 7 represents the isometric view of the stationary BP (V) of the present invention, which may be placed on a granite base plate having high flatness. CC (IV) is fastened to the base platform using precision screws. A free hole (20) is provided to place a mount of a right-angle mirror, which is required to deflect the laser beam for measuring the displacement of the CSA (I) along the Z-axis.

FIG. 8 represents the axes systems, joints and kinematic sub-chains of the 3DoFs WABSS of the present invention, which are explained below:

The global coordinate system is represented by $O_{BP} \rightarrow X_{BP}Y_{BP}Z_{BP}$, where $O_{BP}$ is the center point of the fixed BP (V) and the origin of the global coordinate system, and $X_{BP}$, $Y_{BP}$ and $Z_{BP}$ are the axes along the X-, Y- and Z-directions. The local coordinate system is represented as $O_{CSA} \rightarrow X_{CSA}Y_{CSA}Z_{CSA}$, where the corresponding origin, $O_{CSA}$ is the center point of the moving CSA (I) and $X_{CSA}$, $Y_{CSA}$ and $Z_{CSA}$ are the axes along the X-, Y- and Z-directions. $M_1$, $M_2$ and $M_3$ are three kinematic sub-chains situated 120° apart from each other. Each of the sub-chains ($M_1$, $M_2$ and $M_3$) consists of two joints—one prismatic and one planar joint. $P_1$, $P_2$ and $P_3$ are three planar joints of $M_1$, $M_2$ and $M_3$, respectively, $P_1$, $P_2$ and $P_3$ are formed between the top surface of each flat pad air bearing (9) and the corresponding stainless-steel plates (3a, 3b and 3c). $T_1$, $T_2$ and $T_3$ are three prismatic joints of $M_1$, $M_2$ and $M_3$, respectively, where $T_1$, $T_2$ and $T_3$ are formed between each SBA (II) and the corresponding CA (III).

FIG. 9 represents the kinematic diagram of the 3DoFs WABSS of the present invention. All the points, vectors and angles of the kinematic diagram are listed below.

$B_i$ is the point where the central axis of prismatic joint, $T_i$, meets with the BP (V), ($\forall i=1, 2, 3$). $H_i$ is the point where the central axis of the prismatic joint, $T_i$, meets with the wedge plane or planar joint, $P_i$ ($\forall i=1, 2, 3$) and $C_i$ is the center point of $P_i$.

$M_i$ ($\forall i=1, 2, 3$) consist of five vectors, $\vec{b_i}(\overrightarrow{O_{BP}B_i})$, $\vec{h_i}(\overrightarrow{B_iH_i})$, $\vec{p_i}(\overrightarrow{H_iC_i})$, $\vec{w_i}(\overrightarrow{O_{CSA}C_i})$ and $\overrightarrow{CSA_o}$ ($\overrightarrow{O_{BP}O_{CSA}}$) or the output motion vector of $O_{CSA}$ with respect to the global coordinate system, $O_{BP} \rightarrow X_{BP}Y_{BP}Z_{BP}$. $\hat{N}_i$ represents the unit normal vector of plane $P_i$ ($\forall i=1, 2, 3$). Here, $\psi_1$, $\psi_2$ and $\psi_3$ are the orientations of vectors $\vec{b_1}$, $\vec{b_2}$ and $\vec{b_3}$, respectively, with respect to the global X-axis, that is, $O_{BP}X_{BP}$. Again, $\theta_1$, $\theta_2$ and $\theta_3$ are the orientations of vectors, $\vec{w_1}$, $\vec{w_2}$ and $\vec{w_3}$, respectively, with respect to the local X-axis, that is, $O_{CSA}X_{CSA}$. Also, $\phi_1$, $\phi_2$ and $\phi_3$ are the angles between $Z_{CSA}=0$ plane and planes of planar joints, $P_1$, $P_2$ and $P_3$, respectively.

SUMMARY

Figure 1:
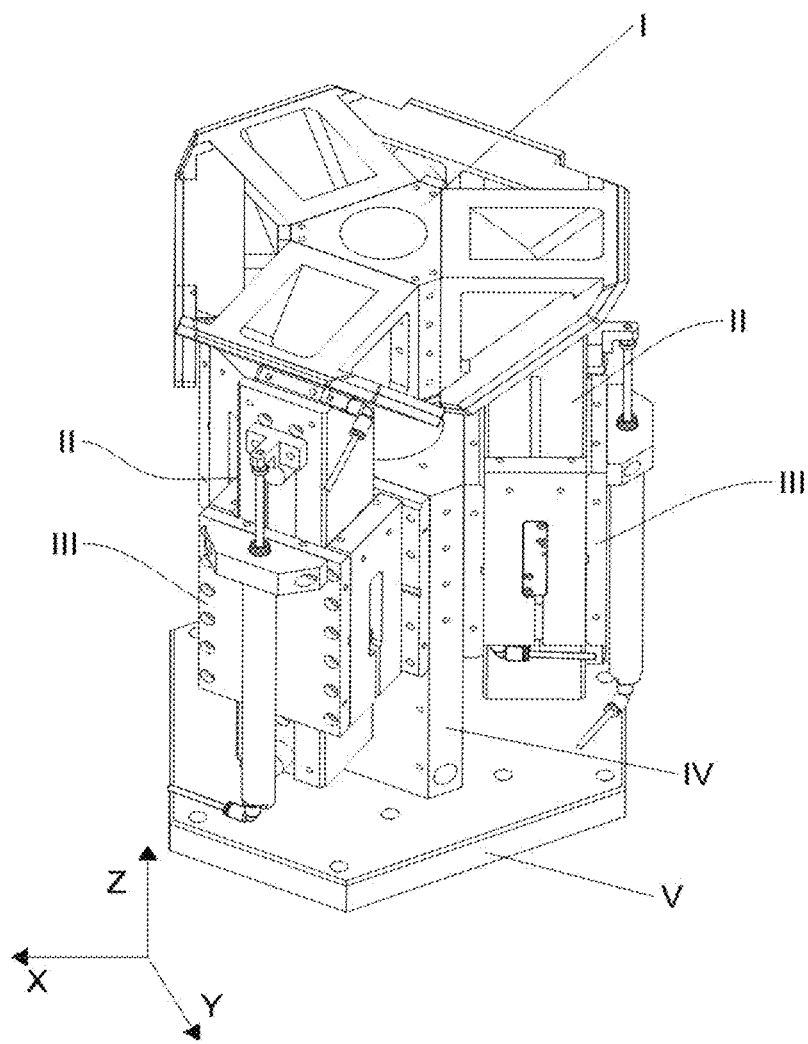
Figure 2A:
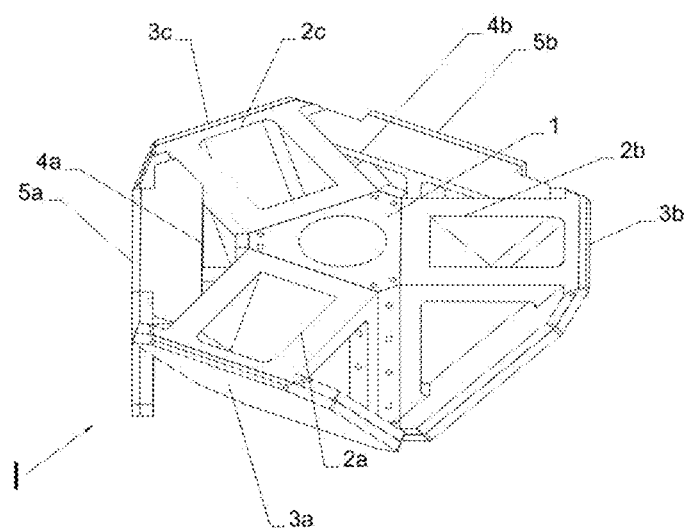
Figure 2B:
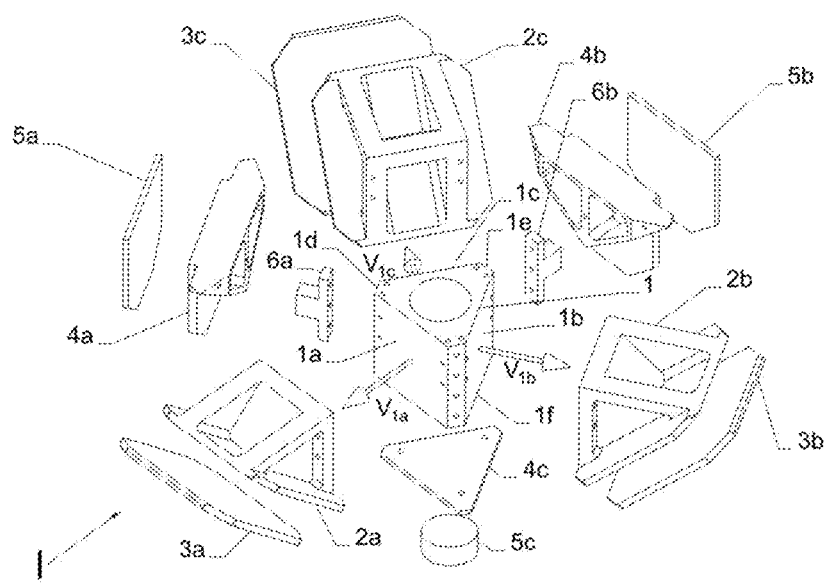
Figures 3A, 3B:
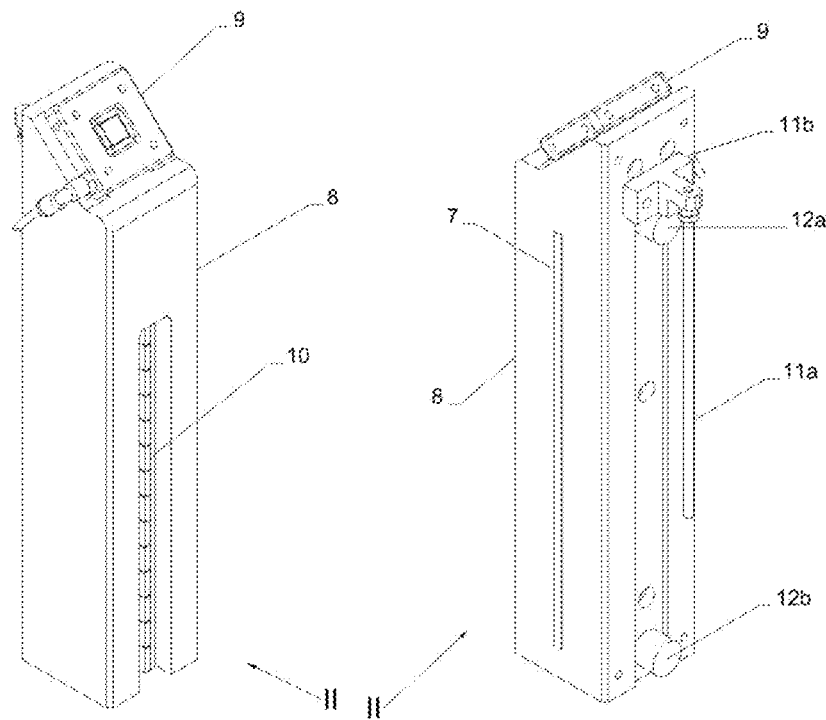
Figure 4:
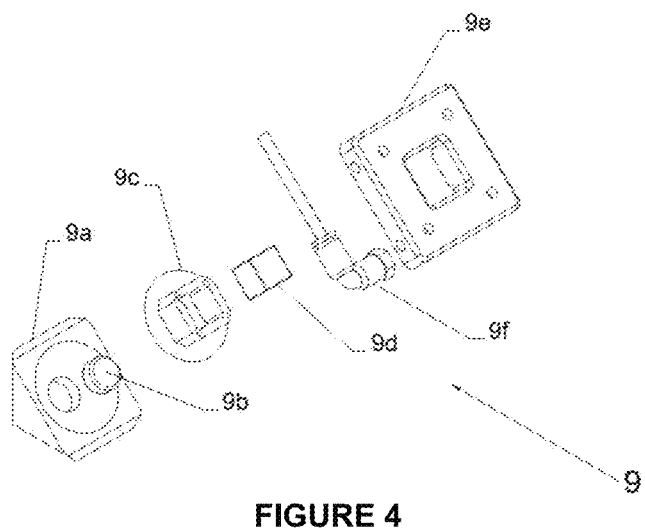
Figure 5A:
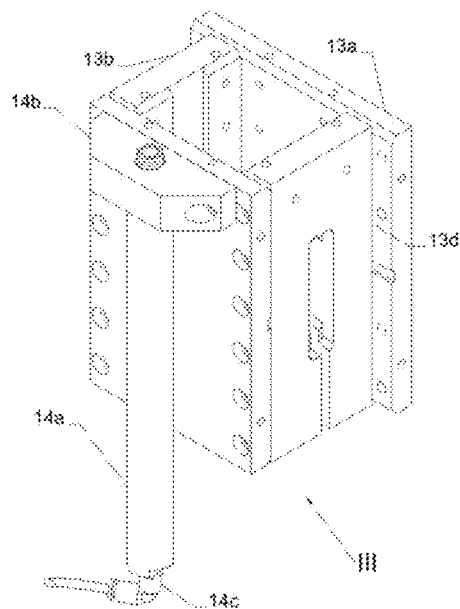
Figure 5B:
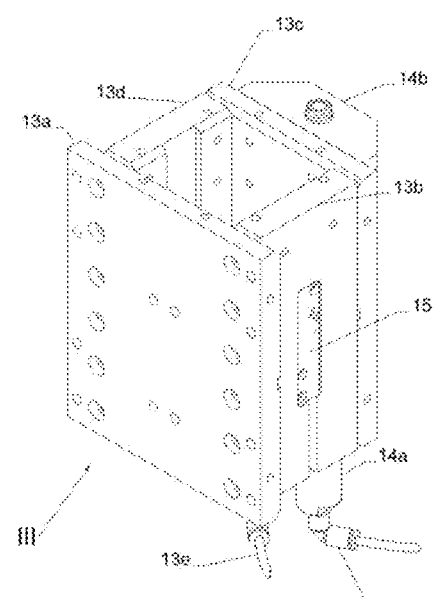
Figure 5C:
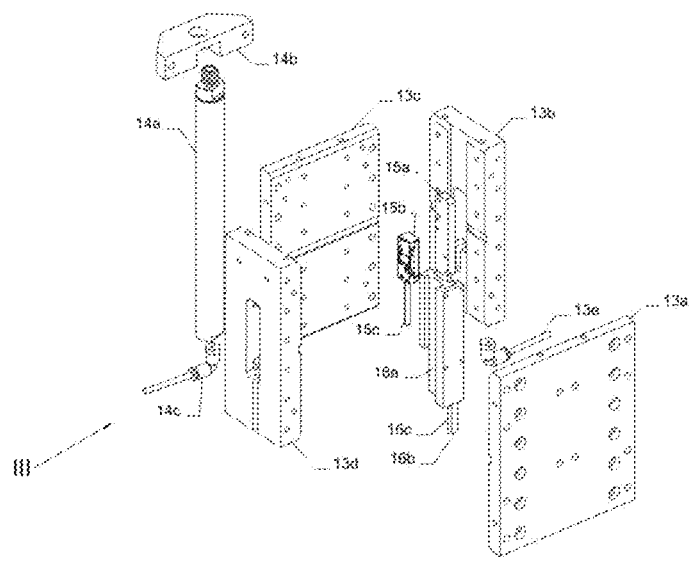

Accordingly the present invention provides a three degrees of freedom (3DoFs) precision positioning Wedge Air Bearing Stage System (WABSS), which comprises of a movable CSA (I) connected to a stationary BP (V) via three SBAs (II) corresponding three CAs (III) and a vertical CC (IV), where CSA (I) can translate along three axes for precision positioning by controlled and coordinated motion of the three SBAs (II) via the parallel kinematic principle, when a linear air bearing (13) based active prismatic joint ($T_i$, $\forall i=1, 2, 3$), and a flat pad air bearing (9) based planar joint ($P_i$, $\forall i=1, 2, 3$) are provided in each kinematic sub-chain, ($M_i$, $\forall i=1, 2, 3$) such that linear actuation is provided through an ironless linear motor at each $T_i$, ($\forall i=1, 2, 3$) to make cogging free frictionless translations of slide bars (8) along the Z-axis within corresponding CA (III); the linear actuation is controlled via position feedback obtained from an optical linear encoder with reading head (15b) and optical scale (7), such that the planar joints ($P_i$, $\forall i=1, 2, 3$) can maintain a stiffness in the presence of a magnetic preloading at the flat pad air bearings (9); the pneumatic counterbalance attached to each prismatic joint ($T_i$, $\forall i=1, 2, 3$) can maintain quick settling as well as gravity compensation for achieving high precision and fault tolerant in sudden power off situation, in addition to provision for further enhancement of precision via three plane mirrors (5a, 5b and 5c) attached to the CSA (I) with the help of mirror brackets and mounts, so that the Abbe principle is followed along the three directions of translations and the vertical topological design being responsible for the independence of the linear geometric error along the Z-axis from the angular tolerances and the relatively small footprint of the system, to achieve smaller thermal and geometric errors.

In an embodiment of the present invention, the 3DoFs WABSS is a precision positioning system based on parallel kinematic principle, that comprises of five major sub-modules expressed as CSA (I), SBAs (II), CAs (III), CC (IV) and BP (V), where the movable wedge-shaped platform CSA (I) is connected to the stationary BP (V) via one vertical CC (IV), three stationary CAs (III) and three translational SBAs (II). The CC (IV) is made triangular wedge shaped, so that three side planes (19a, 19b and 19c) can be placed in such a way that the axes ($V_{19a}$, $V_{19b}$ and $V_{19c}$) perpendicular to these planes make an angle of 120° with each other at the horizontal plane. The three CAs (III) are fastened to these side planes (19a, 19b and 19c), so that they make an angle of 120° with each other for structural symmetry. Each stationary CA (III) forms a prismatic joint with each translational SBA (II) leading to a coordinated parallel motion of the three translational SBAs (II) which subsequently drives the CSA (I) via three corresponding planar joints ($P_1$, $P_2$ and $P_3$). Further, an object to be positioned along the three axes, that is X-, Y- and Z-axes is placed on the top surface of the CSA (I).

In another embodiment of the present invention, the movable CSA (I) has three wedges, 2a, 2b and 2c that are at an angle of 120° apart from each other and are joined to the vertical surfaces, 1a, 1b and 1c of the wedge column (1), respectively. Three plates, 3a, 3b and 3c, made of ferromagnetic material (here, stainless steel), are fixed with wedges (2a, 2b and 2c), respectively, at the wedge planes, to ensure magnetic preloading effect of flat pad air bearing (9). The magnetic preloading and the required air gap are present to maintain the required bearing stiffness at the corresponding planar joint ($P_1$, $P_2$ and $P_3$) between the flat pad air bearing (9) of corresponding SBAs (II) and surface (high flatness) of the stainless-steel plates (3a, 3b and 3c) of CSA (I). The nominal angle between each of the wedge planes and the horizontal plane or XY-plane is kept as 45° to ensure rotation free planar joints $P_1$, $P_2$ and $P_3$, according to the displacement sub-group theory. Each wedge is a part of each of the kinematic sub-chains ($M_1$, $M_2$ and $M_3$). Two mirror mounts, 4a and 4b are mounted on the wedge column (1) via mirror brackets 6a and 6b, respectively, on the vertical surfaces, 1e and 1d, where two plane mirrors (5a and 5b) are attached. The third plane mirror (5c) is attached to the mirror mounts (4c), which are attached at the bottom surface (1f) of the wedge column (1). As an alternate kinematic calibration, the placements or arrangements of plane mirrors (5a, 5b and 5c) are made in such a way that three laser beams coming out from interferometers along the directions of the translations of the CSA (I) can be incident on the plane mirrors (5a, 5b and 5c) to measure the position or pose or displacements of the CSA (I) in three dimensional space, which means the measurement axis is the same as the axis of translation in all the three directions leading to a Abbe error free kinematically calibrated system.

In yet another embodiment of the present invention, three planar joints, $P_1$, $P_2$ and $P_3$, are created between the three SBAs (II) and the corresponding wedge planes of stainless-steel plates, that is, 3a, 3b and 3c, respectively, present in the CSA (I). Nozzles are present at the bearing plate (9e) of flat pad air bearing (9) to facilitate the required air flows where the magnetic preloading is used for maintaining the required stiffnesses at each of the planar joints ($P_1$, $P_2$ and $P_3$). Three flat pad air bearings (9) are provided at three planar joints ($P_1$, $P_2$ and $P_3$) to float the CSA (I) for frictionless motion at the time of positioning. Each of the flat pad air bearing (9) is attached on the top surface of the corresponding slide bar (8) of the corresponding SBA (II) through an angular base (9a). The top plane of the angular base is at an angle of 45° with its horizontal bottom plane to ensure the parallelism with the corresponding stainless-steel plates (3a, 3b and 3c) of the CSA (I) as the wedge angle is also at 45° with horizontal plane. A cylindrical magnet (9b) is placed inside the flat pad air bearing angular base (9a) to hold a block magnet holder (9c) with the help of a strong magnetic force. A block magnet (9d), made of a permanent magnet, is placed inside the block magnet holder (9c) for magnetic preloading to ensure the high stiffness at each of the planar joints ($P_1$, $P_2$ and $P_3$). Flat pad air bearing plate (9e) is attached on the air bearing angular base (9a) to ensure the flow of air at each planar joint via air pressure line (9f).

In still another embodiment of the present invention, three prismatic joints, $T_1$, $T_2$ and $T_3$ are formed between three SBAs (II), which can translate along the Z-direction and the corresponding stationary CAs (III) for realizing the controlled translational motions for movement of the CSA (I), to achieve the desired positioning. Three SBAs (II) are translated in a synchronized manner, following the developed kinematic principle, with the help of the corresponding ironless linear motors. The actual translations provided at the corresponding SBAs (II) are measured via the corresponding optical linear encoder for feedback. The optical scale (7) of the linear encoder attached to the surface of the slide bar (8) moving along the Z-direction with the slide bar (8) and the corresponding reading head (15b) is present at the corresponding stationary CAs (III). Linear air bearing (13) is present between each of the SBAs (II) and the corresponding stationary CAs (III) for ensuring the frictionless translation of the corresponding slide bars (8) or active prismatic joints ($T_1$, $T_2$ and $T_3$). Four number of plates (13a, 13b, 13c and 13d) having miniature nozzles for ensuring controlled air flow during operation with a particular air pressure through air pressure line (13e) are present at each of the CAs (III) to create the linear air bearing (13). Plate, 13a is joined to the stationary vertical CC (IV) to make the CAs (III) stationary. Plates, 13b and 13d are connected with plates, 13a and 13c at opposite faces via screwed connections. Air pressure line (13e) to the linear air bearing is provided at the lower surface of the plate, 13b. The modular system of the linear air bearing can be disassembled, if any fault is detected in the bearing or in other modules, like linear motor or encoder, for necessary repairing.

Figure 12:
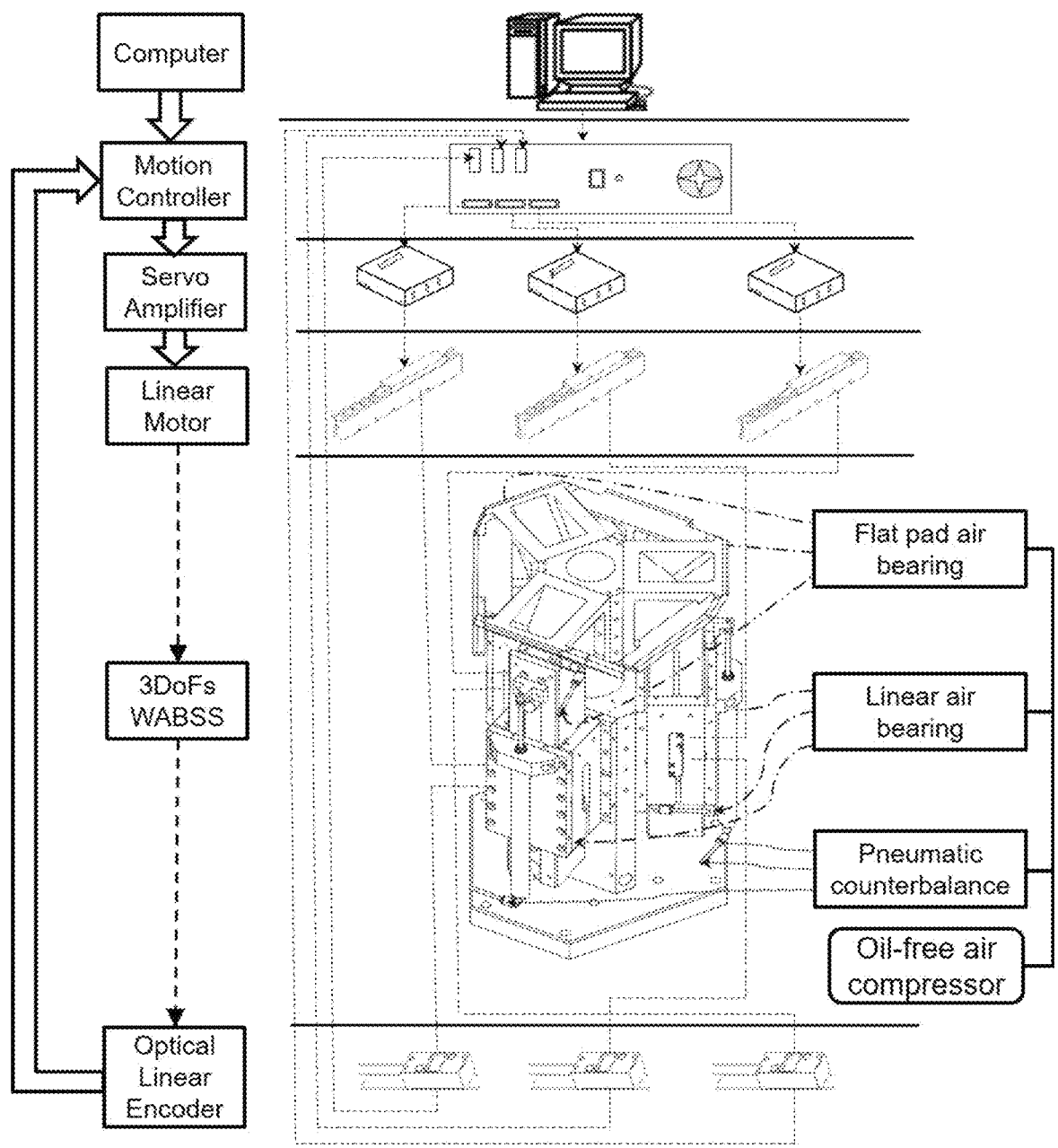
FIG. 12 represents the overall working of the 3DoFs WABSS of the present invention, where connections of the system with oil free air compressor, motion controller and computer are schematically shown.

In still another embodiment of the present invention, ironless linear motors are used for controlled translations of three SBAs (II), where the magnetic track (10) is attached to the slide bar (8) of each of the SBAs (II) and the corresponding motor coil (16a) is attached to plate (13a) of the corresponding CA (III). In this configuration, the magnetic track (10) is allowed to translate by energizing the stationary motor coil (16a) through the control command, which is communicated to the linear motor via the cable (16b) from the servo amplifier and motion controller, as represented in FIG. 12 using pulse width modulation (PWM) or linear modulation. The regions or sectors are detected via Hall sensing through sensor cable (16c) for electronic commutations. The motor coil (16a) is stationary for ensuring lower heat generation and for avoiding cable management. This type of direct drive actuation system is employed for overcoming the presence of other mechanical transmission elements, thereby, enhancing the efficiency of transmission, reducing the weight of the system and increasing the stiffness to achieve high precision. The actuation of the linear motor is controlled via the position feedback obtained from an optical linear encoder where the encoder scale (7) is attached to the slide bar (8) of each SBA (II) and the encoder read head (15b) is connected to the plate (13b) of the corresponding stationary CA (III) via a mounting plate (15a). Thus, the translation of each SBA (II) is measured from the moving encoder scale (7) and the stationary reading head (15b). This information of translation is communicated to the motion controller via the encoder signal cable (15c) and the connector for position feedback. The reading head (15b) is connected to the stationary CAs (III) for avoiding complex cable management.

In still another embodiment of the present invention, three pneumatic counterbalance systems are used to compensate the vertical loads, quick settling for positioning of the CSA (I) and protection of the system at the time of a sudden power-off situation. The reduction of weight can help to achieve high load to weight ratio and to reduce heat generation. Each pneumatic counterbalance system is a piston-cylinder assembly, where air flow is provided for frictionless motion and maintenance free operation. The piston (11a) of each pneumatic counterbalance system is hanging from a mount (11b) at the rear side of the slide bar (8) of the corresponding SBA (II), where the cylinder (14a) is hanging from the mounting plate (14b) of the corresponding CA (III). The flow of air is provided via port (14c) placed at the bottom of cylinder (14a).

In still another embodiment of the present invention, the upper and lower limit stoppers (12a and 12b) that are mounted at the back side of the slide bar (8) are utilized to prevent any foul play due to unprecedented movements in the system caused by mishandling or wrong command.

In still another embodiment of the present invention, there is a provision for obstacle-free path to allow laser beams to fall on the plane mirror (5c) attached at the bottom of the CSA (I) for further kinematic calibration of the 3DoFs WABSS. A right-angle mirror may be placed at the center of the hole (20) present in the stationary BP (V), for changing the directions from horizontal to vertical of the incident and reflected laser beams of laser beam interferometer. Then the beams can travel through the central axis of hole (18) present at CC (IV) and incident at the bottom mirror (5c) at CSA (I). The reflected beam follows the same path in a reverse way and is acquired at laser interferometer for measurement of displacement of CSA(I) along the Z-axis. The provisions for measurements of the translations of the CSA (I) along the X- and Y-axes are also made, where two plane mirrors, 5a and 5b, are attached to the side walls, 1d and 1e of the wedge column (1) of the CSA (I) via mirror mounts, 4a and 4b, and mirror brackets, 6a and 6b, respectively. Two other plane mirror laser interferometers can be used to measure the pose or position or translations of the CSA (I) along X- and Y-axes. The provisions are made in such a way that the measurement axis and translational axis are aligned, so that the measurements will be free from Abbe errors.

In still another embodiment of the present invention, the wedge-shaped CSA (I) is responsible for constraining the rotation at the planar joints ($P_1$, $P_2$ and $P_3$) and only allowing for translations along three axes. According to the structural topology of the present invention, three wedges of the CSA (I) have planar joints ($P_i$), which are at 45° angle with the horizontal plane due to the unique wedge shape of the CSA. Thus, the corresponding normal vectors, $\widehat{N_1}$, $\widehat{N_2}$ and $\widehat{N_3}$ are obviously non-parallel with each other. Therefore, the output motion of the CSA (I) has only three translations and no rotations according to the displacement sub-group theory, which enhances stiffness of the system.

In still another embodiment of the present invention, the unique vertical structure, realizable due to wedge shape of CSA (I) and vertical CC (IV), ensures a small foot print, thereby, leading to smaller thermal distortion and geometric errors from flatness of the base plate to achieve the same workspace volume.

In still another embodiment of the present invention, the unique structural topology of the 3DoFs WABSS ensures that the linear geometric error of the system along the Z-axis is independent of the angular tolerances.

DETAILED DESCRIPTION

A complete description of the present invention, a three degrees of freedom (3DoFs) precision positioning wedge air bearing stage system (WABSS), is presented as follows. A CSA (I) is used for holding or placing of a component for positioning with a high precision by translation of the CSA (I) to the desired position with respect to the global coordinate system ($O_{BP} \rightarrow X_{BP} Y_{BP} Z_{BP}$) present at the stationary BP (V), by coordinated translations of three SBAs (II), parallel to each other, following a kinematic principle. Three wedges (2a, 2b and 2c) are attached via precision screws to the surface walls, 1a, 1b and 1c, respectively, of wedge column (1) of the CSA (I), where the axes $V_{1a}$, $V_{1b}$ and $V_{1c}$, perpendicular to the planes of 1a, 1b and 1c, respectively, are spaced apart 120° from each other at the horizontal plane. Therefore, the wedges are also 120° apart from each other as they are attached to the side walls (1a, 1b and 1c) of wedge column (1). The wedge plane of each wedge (2a, 2b and 2c) is at 45° with the horizontal plane or XY plane. A stainless-steel plate or a plate of any ferromagnetic material (3a, 3b, and 3c) is fixed to the wedge plane of each wedge (2a, 2b and 2c). A flat pad air bearing (9) having magnetic pre-loading capability is provided at the top of each SBA (II), where the bearing plate of the flat pad air bearing (9e) is also at an angle of 45° with the horizontal plane to make this plane parallel with the bearing plane of the stainless-steel plate (3a, 3b and 3c) to form a planar joint ($P_1$, $P_2$, and $P_3$). To orient the bearing surface (9e) at 45°, an angular base (9a) is provided whose upper surface is at 45° with the horizontal and the horizontal surface of the angular base (9a) is attached on the top horizontal surface of the corresponding slide bar (8) via precision screws. The bearing surfaces of the ferromagnetic plates (3a, 3b and 3c) are maintained parallel, nominally, to the corresponding bearing plate (9e) for forming the planar joints ($P_1$, $P_2$, and $P_3$) between the CSA (I) and three SBAs (II). One permanent magnet of cylindrical shape (9b) is provided to hold the block magnet holder (9c) on the top surface of angular base (9a), where block magnet holder (9c) is used to hold the block magnet (9d), a permanent magnet. Magnets, 9b and 9d, are used for magnetic preloading for the flat pad air bearing (9) at each planar joint ($P_1$, $P_2$, and $P_3$) to maintain stiffness. The rotational degrees of freedom of each planar joint are constrained due to the wedge shape structure of the CSA (I), as per displacement subgroup theory. A plate of stainless-steel material or any ferromagnetic material (3a, 3b and 3c) is provided to allow magnetic preloading at the flat pad air bearing (9) present at each planar joint ($P_1$, $P_2$, and $P_3$) for maintaining the required stiffness (20 N/μm) with an air gap of 10 μm by an air pressure of 550 to 620 kPa supplied to each flat pad air bearing (9) through air pressure line (9f) from an oil-free air compressor. Stainless steel material plates (3a, 3b and 3c) are preferable to maintain the flatness for precision in the gap and corrosion-free structure. Each of the SBAs (II) consists of a slide bar (8), where a stopped groove is provided to fix the magnetic track (10) of the ironless linear motor into the groove via screws. The corresponding motor coil (16a) is attached via precision screws to the air bearing plate (13a) of the linear air bearing (13) of the corresponding stationary CAs (III). A linear air bearing is assembled from four air bearing plates (13a, 13b, 13c, and 13d) in a particular manner, so that a cuboid shaped linear air bearing can be formed between each CA (III) and the slide bar (8) of the corresponding SBA (II). The air is distributed between the corresponding bearing surfaces via precision nozzles provided at each of the bearing plates (13a, 13b, 13c, and 13d). The air pressure (typically 420 to 550 kPa) to the linear air bearing (13) is supplied from the oil-free air compressor via the air pressure line (13e) connected to the air bearing plate (13b). The linear bearing (13) is provided at each prismatic joint (13a, 13b, 13c, and 13d) for frictionless motion to avoid the force ripple due to friction for increasing the control bandwidth to achieve better dynamic response and to allow less heat generation at the prismatic joints ($T_1$, $T_2$, and $T_3$). Each of the prismatic joints ($T_1$, $T_2$, and $T_3$) is an active prismatic joint, where the motor coil (16a) of the corresponding ironless linear motor is energized via the current command communicated to the three-phase coil via the cables (16b) connected to the corresponding servo amplifier connected to the motion controller. The required commutation is achieved by sensing the required combination via Hall sensor (16c). This command current is responsible for the translation of the corresponding slide bar (8) via the motion of the magnetic track (10) by electromagnetic principle. The position-based motion control of each of the prismatic joints ($T_1$, $T_2$, and $T_3$) is performed via position feedback obtained through the corresponding optical linear encoder, where the optical scale (7) is attached to one side surface of the corresponding slide bar (8) and the encoder reading head (15b) is attached to the air bearing plate (13b) of the linear air bearing (13) via a mount (15a). The position signal with high resolution (typically 2 nm) carrying the amount of translation is communicated to the motion controller for position feedback via the encoder signal cable (15c). Ironless linear motor is used here to generate smooth translation at prismatic joints ($T_1$, $T_2$, and $T_3$), which is the major requirement in this particular application for achieving high precision. The command currents are provided from the motion controller via the servo amplifiers, based on the motions or translations required for the corresponding prismatic joints ($T_1$, $T_2$, and $T_3$) to move the slide bars (8) of the respective SBAs (II) for achieving the required positioning of the CSA (I) or of the origin of local coordinate system ($O_{CSA} \rightarrow X_{CSA} Y_{CSA} Z_{CSA}$) via passive planar joints ($P_1$, $P_2$, and $P_3$). This combination of required translations of the SBAs (II) are set by following a kinematic principle. The linear air bearing plate (13a) of Each CA (III) is fixed to the corresponding side walls (19a, 19b and 19c) of the vertical CC (IV) via precision screws to make the structure vertical, where the axes ($V_{19a}$, $V_{19b}$ and $V_{19c}$) perpendicular to the planes of the side walls (19a, 19b and 19c) are situated 120° apart from each other at the horizontal plane. This arrangement makes the structure symmetrical to minimize the thermal and geometric errors for achieving high precision. The positioning error along the Z-axis, due to manufacturing and assembly tolerances existing in the system, is independent of the angular tolerances due to the unique vertical structure of the system. Also, the thermal deviations and geometric errors induced from flatness are reduced due to the small footprint due to the vertical structure for achieving the same workspace volume (larger than a 47 mm×47 mm×47 mm rhombohedron) at the CSA (I). A pneumatic counterbalance is provided with each of the prismatic joints ($T_1$, $T_2$ and $T_3$), in the form of a pneumatic piston-cylinder assembly, where the piston (11a) is mounted to the slide bar (8) via a piston mount (11b) and the cylinder (14a) is mounted to the air bearing plate (13c) of the linear air bearing (13) of the CA (III) via a cylinder mount (14b). A supply of pressurized air is provided to the cylinder (14b) via an air pressure line (14c) for compensation of gravity load, for quick settling of position and to protect the system from a sudden power off situation. Two limit stoppers (12a and 12b) attached to each slide bar (8) are provided to limit the translations of the prismatic joints, where the range of translation at each of the slide bars (8) or prismatic joint is 0 mm to 84 mm. This range of translation in each of the prismatic joints is required for achieving a rhombohedral workspace volume larger than a 47 mm×47 mm×47 mm by the coordinated motions of all the slide bars (8) following a kinematic principle. The acute and obtuse angles of the rhombohedron are 88.15° and 91.85°, respectively. The straightness of each prismatic joint is maintained typically as ±1 μm. The stiffness at each of the prismatic joint is maintained typically at 90 N/μm with an air pressure of 420 to 550 kPa to each linear air bearing (13). A provision for kinematic calibration is made by integrating plane mirrors (5a, 5b and 5c) with the CSA (I). Plane mirrors (5a and 5b) are attached with mirror mounts (4a and 4b), which are attached with mirror brackets (6a and 6b), respectively. Mirror brackets, 6a and 6b are connected to wedge column (1) at the mounting surfaces, 1d and 1e, respectively. Plane mirror, 5c is attached to mirror mount, 4c, which is connected at the bottom surface (1f) of wedge column (1). At the time of kinematic calibration, laser beams from laser interferometers are incident on the mirrors, 5a, 5b and 5c, to measure the actual position or translations of the CSA (I), so that the axis of measurement is aligned with the axis of translation to avoid any Abbe errors. The laser beam to be used for the measurement of the translation of the CSA (I) along the Z-axis can travel via a right-angle mirror to be placed at the center position of hole (20) provided at the stationary BP (V) to change its direction from horizontal to vertical. The laser beam can travel through the small hole (17) provided at one of the side walls of CC (IV), as shown in FIG. 6, to be incident at the right-angle mirror. The vertical path of the laser beam is the central axis of the cylindrical hole (18) provided at CC (IV). After incidence of the laser beam on the surface of the plane mirror (5c), the beam is reflected back and follows the same path to fall on the laser interferometer to find the displacement of the CSA (I) along the Z-axis. This arrangement of plane mirrors enables Abbe error free measurements of the translations of the CSA (I). The overall system is modular, so that any components can be disassembled and assembled easily at the time of servicing or repairing, if required. Also, the motor cables (16b and 16c), encoder signal cables (15c), pipes for air flow (14c and 13e) are connected with stationary components. Therefore, need for complex cable management and pipe management are avoided for operation.

Figure 9:
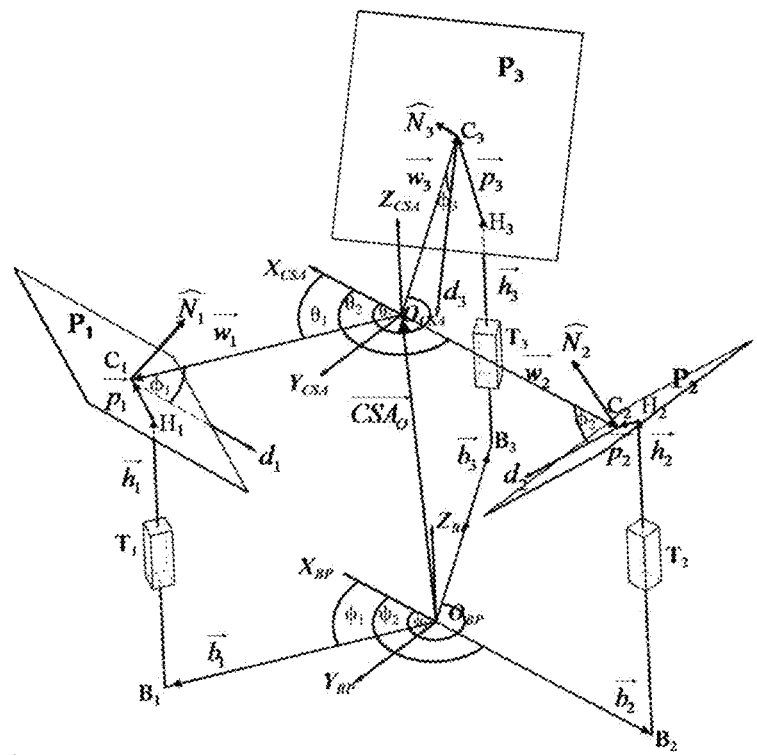

The wedge-shape of the CSA (I) is responsible for constraining the rotation in the planar joints ($P_1$, $P_2$ and $P_3$) and thus only allowing the translations along three axes. The axis system of the 3DoFs WABSS and the corresponding kinematic diagram is presented in FIGS. 8 and 9, respectively, to endow the concept of the wedge-shaped CSA (I). Coordinate systems of the stationary BP (V) and of the movable CSA (I) are represented as $O_{BP} \rightarrow X_{BP} Y_{BP} Z_{BP}$ and $O_{CSA} \rightarrow X_{CSA} Y_{CSA} Z_{CSA}$, respectively, which can also be termed as global and local coordinate systems, respectively. $X_{BP}$, $Y_{BP}$ and $Z_{BP}$ are the X-, Y- and Z-axes, respectively, of the stationary BP (V) and $X_{CSA}$, $Y_{CSA}$ and $Z_{CSA}$ are the X-, Y- and Z-axes, respectively, of the movable CSA (I). The local coordinate system $O_{CSA} \rightarrow X_{CSA} Y_{CSA} Z_{CSA}$ has a relative movement with respect to the static global coordinate system $O_{BP} \rightarrow X_{BP} Y_{BP} Z_{BP}$. The relative movement of the origin, $O_{CSA}$ is determined with respect to the global coordinate system $O_{BP} \rightarrow X_{BP} Y_{BP} Z_{BP}$ to estimate the translation of the CSA (I) by a kinematic analysis. The kinematic diagram of the 3DoFs WABSS is illustrated in FIG. 9, where 3TP configurations are shown, that is, there are only two joints, one active prismatic (T) and one passive planar joint (P), present in each kinematic sub-chain. Therefore, in this structural topology, there are fewer cumulative error due to the presence of only two joints in each kinematic sub-chain ($M_i$) to achieve high stiffness and hence, high precision in ultimate positioning performance. The kinematic configuration of a single subgroup or sub-chain can be represented according to the displacement subgroup theory as:

$$\{\vec{M_i}\} = \{T(\vec{h_i})\} \cup \{G(\hat{N_i})\} \quad (1)$$
$$= \{T(\vec{b_i})\} \cup \{T(\vec{h_i})\} \cup \{T(\vec{p_i})\} \cup \{R(C_i, \hat{N_i})\} \forall i = 1, 2, 3,$$
$$= \{X(\hat{N_i})\}$$

where, motion of each kinematic sub-chain is represented as $\{M_i\}$; translations along the vectors, $\vec{b_i}$, $\vec{h_i}$ and $\vec{p_i}$ are represented as $\{T(\vec{b_i})\}$, $\{T(\vec{h_i})\}$ and $\{T(\vec{p_i})\}$, respectively. Planar motion of the plane having normal vector, $\hat{N}_i$, is denoted as $\{G(\hat{N}_i)\}$. Rotation about the normal vector, $\hat{N}_i$, that is normal to the plane $P_i$ and passing through center point, $C_i$, is represented as $\{R(C_i, \hat{N}_i)\}$. $\{X(\hat{N}_i)\}$ is the motion with three translations and one rotation (Schönflies motion) where the axis of rotation is along the vector, $\hat{N}_i$. The output motion of the CSA (I), $\{\overrightarrow{CSA_o}\}$ can be expressed by intersection operations of the subgroups given by, $$\{\overrightarrow{CSA_O}\} = \begin{cases} \{X(\hat{N}_i)\}, \hat{N_1} \| \hat{N_2} \| \hat{N_3} \\ \{\vec{T}\}, \hat{N_1} \perp \hat{N_2} \perp \hat{N_3} \end{cases} \quad (1)$$

where three orthogonal translations in space are represented as $\{\vec{T}\}$.

According to the structural topology of the present invention, three wedges of CSA (I) have planar joints $(P_i)$, which are at 45° angle with the horizontal plane due to the unique wedge shape of CSA (I). Thus, the corresponding normal vectors, $\vec{N_1}$, $\vec{N_2}$ and $\vec{N_3}$ are obviously non-parallel. Therefore, as per Eq. (2), the output motion of the CSA (I) has only three translations and no rotations. The unique vertical structural topology of the 3DoFs WABSS is ensuring that the linear geometric error along the Z-axis is independent of the angular tolerances present in the system. This is illustrated with the help of kinematic analysis and geometric error (along X-, Y- and Z-axes) analysis. In the present invention, the kinematic structure of the system (FIG. 9) consists of one vector loop corresponding to each sub-group, and thus in total three closed kinematic loops are present. Nominally, each loop has five fixed structural parameter vectors ($\vec{b_i}$, $\vec{w_i}$, $\psi_i$, $\theta_i$ and $\phi_i$) and three variable motion vectors ($\vec{h_i}$, $\vec{p_i}$ and $\overrightarrow{CSA_o}$). Out of the motion vectors, input and output are $\vec{h_i}$ and $\overrightarrow{CSA_o}$, respectively. A kinematic solution is performed here to obtain the pose of the moving CSA (I) with respect to the global coordinate system $(O_{BP} \rightarrow X_{BP} Y_{BP} Z_{BP})$. From each closed kinematic loop, the loop closure equation is given by:

$$\overrightarrow{CSA_O} = \vec{b_i} + \vec{h_i} + \vec{p_i} - \vec{w_i}, \quad (2)$$

where, $$\overrightarrow{CSA_O} = \overrightarrow{O_{BP}O_{CSA}} = [x \ y \ z]^T, \quad (3)$$

(x, y, z are the co-ordinates of $O_{CSA}$ with respect to the global reference frame, $O_{BP} \rightarrow X_{BP} Y_{BP} Z_{BP}$)

$$\vec{b_i} = \overrightarrow{O_{BP}B_i} = [\|\vec{b_i}\|\cos\psi_i \ \|\vec{b_i}\|\sin\psi_i \ 0]^T, \quad (4)$$

$$\vec{h_i} = \overrightarrow{B_iH_i} = [0 \ 0 \ \|\vec{h_i}\|]^T, \quad (5)$$

and $$\vec{w_i} = \overrightarrow{O_{CSA}C_i} = [\|\vec{w_i}\|\cos\theta_i \ \|\vec{w_i}\|\sin\theta_i \ 0]^T. \quad (6)$$

Hence, $\vec{p_i}$ can be obtained by putting the expressions of $\overrightarrow{CSA_o}$, $\vec{b_i}$, $\vec{h_i}$ and $\vec{w_i}$ from Eqs. (4-7) into Eq. (3) as:

$$\vec{p_i} = [x - \|\vec{b_i}\|\cos\psi_i \ \|\vec{w_i}\|\cos\psi_i \ y - \|\vec{b_i}\|\sin\psi_i + \|\vec{w_i}\|\sin\theta_i \ z - \|\vec{h_i}\|]^T \quad (7)$$

Also, the unit normal vector of plane $P_i$ is stated as:

$$\hat{N}_i = [-\sin\phi_i\cos\theta_i \ -\sin\phi_i\sin\theta_i \ \cos\phi_i]^T \quad (8)$$

As $\vec{p_i} \perp \hat{N}_i$, then, $$\vec{p_i} \cdot \hat{N}_i = 0 \quad (9)$$

Therefore, substitution of Eqs. (8) and (9) into Eq. (10), yields:

$$x\cos\theta_i + y\sin\theta_i - z\cot\phi_i = A_i \quad (\forall i = 1, 2, 3), \quad (10)$$

where, $$A_i = \|\vec{b_i}\|\cos(\psi_i - \theta_i) - \|\vec{w_i}\| - \|\vec{h_i}\|\cot\phi_i \ \forall i = 1, 2, 3$$

By substituting, $A_i$, $\forall i=1, 2, 3$ from Eq. (11), the inverse and forward kinematic solutions are obtained from Eqs. (12) and (13), respectively as:

$$\begin{cases} \|\vec{h_1}\| = \|\vec{b_1}\|\cos(\psi_1 - \theta_1)\tan\phi_1 - \|\vec{w_1}\|\tan\phi_1 - x\tan\phi_1\cos\theta_1 - \\ y\tan\phi_1\sin\theta_1 + z \\ \|\vec{h_2}\| = \|\vec{b_2}\|\cos(\psi_2 - \theta_2)\tan\phi_2 - \|\vec{w_2}\|\tan\phi_2 - x\tan\phi_2\cos\theta_1 - \\ y\tan\phi_2\sin\theta_2 + z \\ \|\vec{h_2}\| = \|\vec{b_3}\|\cos(\psi_3 - \theta_3)\tan\phi_3 - \|\vec{w_3}\|\tan\phi_3 - x\tan\phi_3\cos\theta_3 - \\ y\tan\phi_3\sin\theta_3 + z \end{cases} \quad (12)$$

and $$\begin{cases} x\cos\theta_1 + y\sin\theta_1 - z\cot\theta_1 = \|\vec{b_1}\|\cos(\psi_1 - \theta_1) - \|\vec{w_1}\| - \|\vec{h_1}\|\cot\phi_1 \\ x\cos\theta_2 + y\sin\theta_2 - z\cot\theta_2 = \|\vec{b_2}\|\cos(\psi_2 - \theta_2) - \|\vec{w_2}\| - \|\vec{h_2}\|\cot\phi_2 \\ x\cos\theta_3 + y\sin\theta_3 - z\cot\theta_3 = \|\vec{b_3}\|\cos(\psi_3 - \theta_3) - \|\vec{w_3}\| - \|\vec{h_3}\|\cot\phi_3 \end{cases} \quad (11)$$

By solving the sets of Eqns. (13), x, y, z can be obtained as, $$\begin{cases} x = \{A_1(\sin\theta_3\cot\phi_2 - \sin\theta_2\cot\phi_3) + A_2(\sin\theta_1\cot\phi_3 - \sin\theta_3\cot\phi_1) + \\ A_3(\sin\theta_2\cot\phi_1 - \sin\theta_1\cot\phi_2)\}/Det \\ y = \{A_1(\cos\theta_2\cot\phi_3 - \cos\theta_3\cot\phi_2) + A_2(\cos\theta_3\cot\phi_1 - \cos\theta_1\cot\phi_3) + \\ A_3(\cos\theta_1\cot\phi_2 - \cos\theta_2\cot\phi_1)\}/Det \\ z = \{A_1\sin(\theta_3 - \theta_2) + A_2\sin(\theta_1 - \theta_3) + A_3\sin(\theta_2 - \theta_1)\}/Det \end{cases} \quad (12)$$

where, $$Det, \cot\theta_1\sin(\theta_2 - \theta_3) + \cot\phi_2\sin(\theta_3 - \theta_1) + \cot\phi_3\sin(\theta_1 - \theta_2)$$

In the present invention, the nominal structural topology is designed with $\phi_1 = \phi_2 = \phi_3 = 45°$, $\|\vec{b_1}\| = \|\vec{w_1}\|$, $\|\vec{b_2}\| = \|\vec{w_2}\|$ and $\|\vec{b_3}\| = \|\vec{w_3}\|$. At the nominal pose, $\psi_1 = \theta_1 = 45°$, $\psi_2 = \theta_2 = 165°$ and $\psi_3=\theta_3=285°$ are considered. Therefore, a simplified forward kinematic solution for this present system is as follows:

$$\begin{cases} x = \left(-0.598\|\vec{h_1}\| + 1.115\|\vec{h_2}\| - 0.518\|\vec{h_3}\|\right)/3 \\ y = \left(-0.598\|\vec{h_1}\| + 0.518\|\vec{h_2}\| - 1.115\|\vec{h_3}\|\right)/3 \\ z = \left(\|\vec{h_1}\| + \|\vec{h_2}\| + \|\vec{h_3}\|\right)/3 \end{cases} \quad (13)$$

Further, the volumetric workspace can be determined from Eq. (15). The system can also be controlled by calculating $\|\vec{h_1}\|$, $\|\vec{h_2}\|$ and $\|\vec{h_3}\|$ for achieving a desired co-ordinate within the workspace as follows:

$$\begin{cases} \|\vec{h_1}\| = -0.707(x + y) + z \\ \|\vec{h_2}\| = 0.259(x - y) + z \\ \|\vec{h_3}\| = 0.259(y - x) + z \end{cases} \quad (14)$$

Geometric error modeling of the 3DoFs WABSS is performed for estimating the relationships between the kinematic parameters and the geometric errors along the X-, Y-, and Z-axes in CSA (I) due to manufacturing tolerances, assembly tolerances and tolerances in input motion variables. The manufacturing and assembly tolerances are considered as errors in the kinematic parameters as $\delta b_i$, $\delta w_i$, $\delta \psi_i$, $\delta \theta_i$ and $\delta \phi_i$, and the error due to input motion variable, $\vec{h_i}$ is considered as $\delta h_i$. Due to these tolerances or errors, the output pose error, $\Delta E_p$ of the CSA (I) is:

$$\Delta E_p = [\delta x \quad \delta y \quad \delta z \quad \delta \theta_x \quad \delta \theta_y \quad \delta \theta_z]^T \quad (15)$$

where, $\delta x$, $\delta y$ and $\delta z$ are translational errors of CSA (I) in X-, Y- and Z-directions, respectively, and $\delta \theta_x$, $\delta \theta_y$ and $\delta \theta_z$ are orientation errors of the CSA (I) about X-, Y- and Z-axes, respectively. The error components, $\delta x$, $\delta y$ and $\delta z$ can be obtained by performing total differential of Eq. (11) as:

$$\delta(x\cos\theta_i) + \delta(x\sin\theta_i) - \delta(z\cot\phi_i) = \delta(A_i) \quad (16)$$

Separating the translational error terms of the CSA (I) with corresponding coefficients on the left-hand side from error terms of structural and kinematic parameters on the right-hand side in the total differential of Eq. (18), one obtains:

$$\delta x(\cos\theta_i) + \delta y(\sin\theta_i) - \delta z(\cot\phi_i) = \delta B_i \quad (17)$$

where $$\delta B_i = \delta b_i \cos(\psi_i - \theta_i) - b_i \sin(\psi_i - \theta_i)(\delta\psi_i - \delta\theta_i) - \delta w_i - \quad (18)$$

$$\delta h_i \cot\phi_i + \ldots + \left(\|\vec{h_i}\| - z\right)\cosec^2\phi_i\delta\phi_i + x\sin\theta_i\delta\theta_i - y\sin\theta_i\delta\theta_i$$

Substituting, i=1, 2, 3 into Eq. (19), yields:

$$\begin{cases} \delta x(\cos\theta_1) + \delta y(\sin\theta_1) - \delta z(\cot\phi_1) = \delta B_1 \\ \delta x(\cos\theta_2) + \delta y(\sin\theta_2) - \delta z(\cot\phi_2) = \delta B_2 \\ \delta x(\cos\theta_3) + \delta y(\sin\theta_3) - \delta z(\cot\phi_3) = \delta B_3 \end{cases} \quad (21)$$

By solving the set of Eqn. (21) $\delta x$, $\delta y$ and $\delta z$ are obtained as:

$$\begin{cases} \delta x = \{\delta B_1(\sin\theta_3 - \sin\theta_2) + \delta B_2(\sin\theta_1 - \sin\theta_3) + \\ \quad \delta B_3(\sin\theta_2 - \sin\theta_1)\}/\ Det\ 1 \\ \delta y = \{\delta B_1(\cos\theta_2 - \cos\theta_3) + \delta B_2(\cos\theta_3 - \cos\theta_1) + \\ \quad \delta B_3(\cos\theta_1 - \cos\theta_2)\}/\ Det\ 1 \\ \delta z = \{\delta B_1\sin(\theta_3 - \theta_2) + \delta B_2\sin(\theta_1 - \theta_2) + \delta B_3\sin(\theta_2 - \theta_1)\}/\ Det\ 1 \end{cases} \quad (19)$$

where, $Det1$, $\cot\phi_1\sin(\theta_2 - \theta_3) + \cot\phi_2\sin(\theta_3 - \theta_1) + \cot\phi_3\sin(\theta_1 - \theta_2)$ According to the structural topology of 3DoFs WABSS in the present invention, the nominal values of $\phi_i$ and $(\psi_i-\theta_i)$ are 45° and 0°, respectively. In the present invention, $\psi_1=\theta_1=45°$, $\psi_2=\theta_2=165°$ and $\psi_3=\theta_3=285°$ are considered. Therefore, by substituting these values in Eq. (22), $\forall i=1, 2, 3$, $\delta x$, $\delta y$ and $\delta z$ are estimated in the simplified form as:

$$\begin{cases} \delta x = (0.598\delta B_1 - 1.115\delta B_2 + 0.518\delta B_3)/3 \\ \delta y = (0.598\delta B_1 - 0.518\delta B_2 + 1.115\delta B_3)/\sqrt{3} \\ \delta z = -(\delta B_1 - \delta B_2 + \delta B_3)/3 \end{cases} \quad (23)$$

Therefore, it can be observed from Eq. (23) that the linear geometric errors, $\delta x$, $\delta y$ and $\delta z$ are dependent on $\delta B_1$, $\delta B_2$ and $\delta B_3$. At the time of translation of the CSA (I) along the Z-axis, $\|\vec{h_i}\|-z)=0$, x=0 and y=0, thus the error, $\delta z$, is independent of the angular tolerances, $\delta \phi_i$ and $\delta \theta_i$, due to the presence of the $(\|\vec{h_2}\|-z)$ term in Eq. (20). The z-value represents the translation of $O_{CSA}$ along the Z-axis. Therefore, the linear geometric errors, $\delta z$ of the output pose of CSA (I) is independent of the angular tolerances for the particular vertical topological structure of the present invention. This can also be depicted from the error plot of the whole workspace of the CSA (I) in FIG. 11C, where color codes are representing the overall errors of the CSA (I). Arrangement of plane mirrors (5a, 5b and 5c) for achieving Abbe error free kinematic calibration is also provided with CSA (I), where the mirrors are placed in such a way that the axes of the laser beams for measuring the translations of the CSA (I) are collinear with the axis of the translations to avoid Abbe errors.

In the present invention, the 3DoFs WABSS is used to position an object placed on the CSA (I) at a particular position, where the coordinate of the position is need to be given as the input command. First a flow of clean air is sent to the linear air bearing (13), flat pad air bearing (9) and pneumatic counterbalance cylinder (14a) of each of the kinematic sub-chains ($M_1$, $M_2$ and $M_3$) via the air pressure lines, 13e, 9f and 14c, respectively. Clean air can be obtained by using an oil-free air compressor and air filters. The air pressure at flat pad air bearings (9) and linear air bearings (13) are recommended to maintain typically 550 kPa for achieving 20 N/µm and 90 N/µm normal stiffnesses, respectively. The overall air pressure from the air compressor should not be less than typically 690 kPa. This air pressure ensures the frictionless motion of the prismatic and planar joints with pneumatic counterbalance action. After that the input command is provided by the control computer connected to the motion controller. After obtaining the input command, the motion controller is used for calculation of the required translations, $h_1$, $h_2$ and $h_3$, of the ironless linear motors present at the prismatic joints, $T_1$, $T_2$ and $T_3$, respectively, by following the inverse kinematic principle. Then the corresponding motor coils (16a) are energized through the corresponding servo amplifiers connected to the ironless linear motor coils (16a) at one end and motion controller at the other end. Due to the coil energization, the magnetic track (10) is translated through electromagnetic actuation, and hence the slide bars (8) are also translated. Then the position feedback for the translations of slide bars (8) are obtained from the corresponding optical linear encoder, where its optical scale (7) is attached to the corresponding movable slide bar (8) and the reading head (15b) is attached to the corresponding stationary CA (III). The position feedback is communicated to the motion controller via the signal cable (15c) for each prismatic joint. The feedback option is required for further motion control of the ironless linear motors and hence the slide bars (8) for position or velocity control. Thus, the controlled and coordinated synchronous translations of the three slide bars with a maximum of 84 mm actuations are responsible for achieving the precision positioning of the CSA (I) in a workspace volume larger than a 47 mm×47 mm×47 mm rhombohedron, where the maximum travel ranges along the X-axis, Y-axis and Z-axes are 75 mm, 66 mm and 84 mm, respectively.

The novelties of the present invention are due to its, (1) independence of the geometric error along the Z-axis from the angular tolerances during kinematic calibration as a consequence of the novel and unique vertical topological design, (2) reduced thermal and geometric errors due to a small foot-print for its unique vertical structure, and (3) Abbe error free design for further kinematic calibration, thereby, making 3DoFs WABSS a high precision positioning system.

The non-obvious inventive steps of the present invention rest in (1) the unique mechanical design of the 3DoFs WABSS comprising of a wedge-shaped CSA (I) that executes movement based on a parallel kinematic mechanism by constraining its three rotational motions and allowing only three pure translational motions in the X-, Y- and Z-axes respectively, for high precision positioning, (2) the CSA (I) being kinematically linked to three kinematic sub-chains, thereby, forming three closed loops with a minimum number of joints, that is, one prismatic (presence of a direct drive linear motor with pneumatic counterbalance that is responsible for gravity or weight compensation and protection from sudden power cut) and one planar joint in each kinematic sub-chain, both guided by aerostatic bearings for smooth motion, subsequently leading to reduction in the cumulative errors and inducing of high efficiency translation, high stiffness, for precision positioning, (3) independency of the geometric error along the Z-axis ($\delta z$) from angular tolerances due to the unique wedge-shaped vertical structure of the 3DoFs WABSS, that is, increased range of Z-axis translation resulting in increased workspace volume without compromising on the level of precision, (4) collinearity between the axis of motion of the 3DoFs WABSS with fixed plane mirrors on the wedges of the CSA (I) and the axis of measurement of the laser interferometers, during kinematic calibration leading to a Abbe error free system, within the limit of the present specifications. These constructional features and associated mechanisms are identified as the non-obvious inventive steps in the system of the present invention.

EXAMPLES

The following examples are given by way of illustration of the working of the invention in actual practice and therefore should not be construed to limit the scope of the present invention.

Example—1

Figure 10:
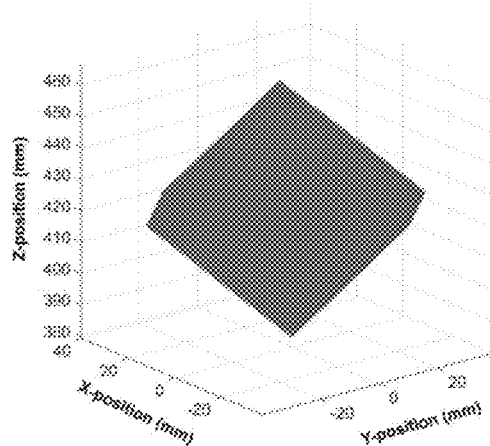
FIG. 10 represents a plot of the total workspace volume of the CSA (I) or the trajectory of point, $O_{CSA}$, of the present invention due to the translations produced by the linear motors in the three SBAs (II), following kinematic principle.

In the system of the present invention, the actuation in each of the iron-less linear motor is given with a full range from 0 mm to 84 mm by following the kinematic principle. The full workspace of the system is found to be larger than a 47 mm×47 mm×47 mm rhombohedron, where the maximum travel of CSA (I) along the X-, Y- and Z-axes are 75 mm, 66 mm and 84 mm, respectively. The workspace volume of CSA (I) is shown in FIG. 10. An error analysis of the 3-DoFs WABSS is demonstrated by an example that uses typical tolerance values of the six kinematic parameters per kinematic sub-chain, as shown in Table 1.

TABLE 1

Tolerance values of the kinematic parameters of 3DoFs WABSS

| Linear Tolerances (All dimensions are in mm) | | | | | | | | |
| --- | --- | --- | --- | --- | --- | --- | --- | --- |
| $\delta b_1$ | $\delta b_2$ | $\delta b_3$ | $\delta w_1$ | $\delta w_2$ | $\delta w_3$ | $\delta h_1$ | $\delta h_2$ | $\delta h_3$ |
| 0.01 | 0.01 | 0.01 | 0.01 | 0.01 | 0.01 | 0.00001 | 0.00001 | 0.00001 |
| Angular Errors (All dimensions are in rad) | | | | | | | | |
| $\delta \Psi_1$ | $\delta \Psi_2$ | $\delta \Psi_3$ | $\delta \theta_1$ | $\delta \theta_2$ | $\delta \theta_3$ | $\delta \varphi_1$ | $\delta \varphi_2$ | $\delta \varphi_3$ |
| 0.000015 | 0.000015 | 0.000015 | 0.000015 | 0.000015 | 0.000015 | 0.000015 | 0.000015 | 0.000015 |

Figure 11A:
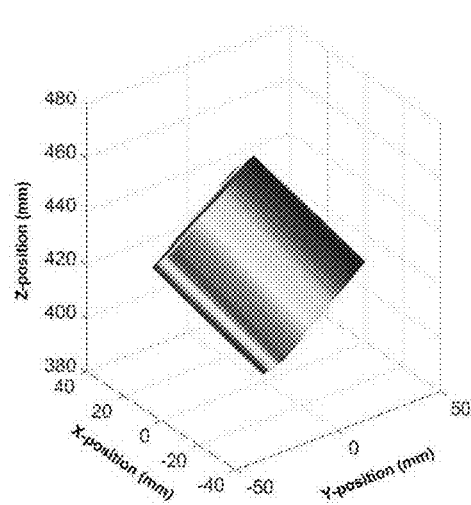
FIGS. 11A, 11B and 11C represent plots of linear geometric errors along the X-, and the Y-axis and the overall geometric errors, respectively, of the CSA (I) for its total workspace volume of the present invention, due to the tolerances considered in the kinematic parameters, which are taken as typical values. The color bar indicates the geometric error in mm.
Figure 11B:
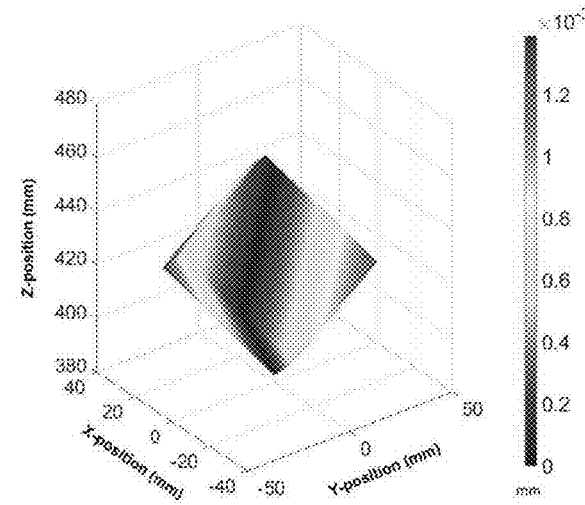
Figure 11C:
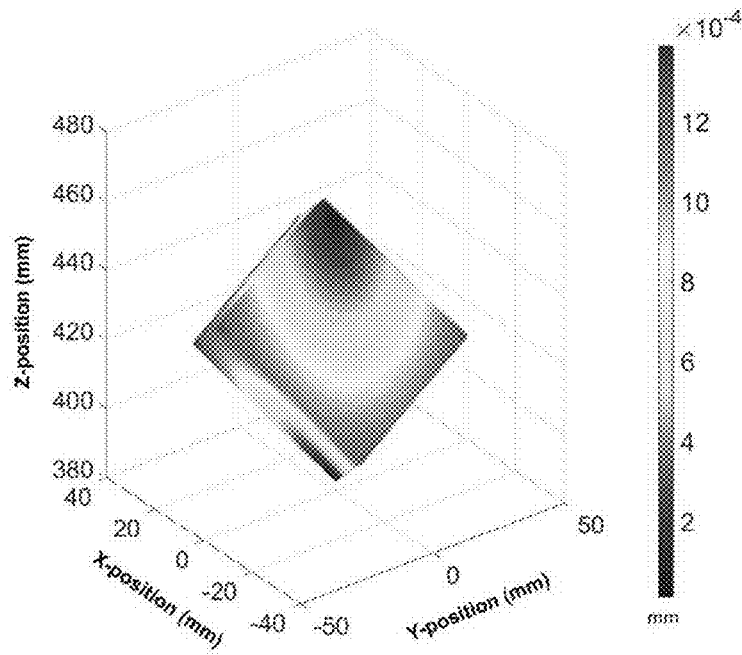

The plots of the linear geometric errors of CSA (I) along the X-, and Y-directions are shown in FIGS. 11A and 11B respectively. The plot of the error distribution, in the Z-direction is not shown since it is essentially equal to $\delta h_i$ ($+/-10^{-5}$ mm, in this case). The variations of $\delta z$ over the whole workspace are thus negligible, as the term, $(\|\vec{h_i}\|-z)$, in $\delta B_i$, $\forall i=1, 2, 3$ is zero for only vertical translations. The overall error of CSA (I) is plotted in FIG. 11C that spans the sub-micron to micron range. It is observed from the color codes of the plots in FIG. 11 that the maximum errors are present at the boundaries of the workspace and their vicinity. The errors are minimum at the central portion of the workspace irrespective of translations along the Z-axis. Hence, the error, δz, is not affected by the angular errors, δϕ$_i$, δθ$_i$. This happens because $(\|\vec{h_2}\|-z)=0$, x=0 and y=0, for the Z-axis translation, which is unique due to the vertical structural topology of the 3DoFs WABSS in which actuation takes place in the Z-axis direction.

The Main Advantages of the Present Invention are:
1. It is a high precision positioning parallel kinematic system with high stiffness and low cumulative errors.
2. It has air bearing based three planar joints ($P_1$, $P_2$ and $P_3$) with magnetic preloading and three prismatic joints ($T_1$, $T_2$ and $T_3$) with ironless linear motors to ensure a frictionless direct drive system for motion without cogging to achieve high control bandwidth.
3. It has a unique vertical structural topology, where actuation takes place in the Z-axis direction and the linear geometric error of the CSA (I) along the Z-axis is independent of the angular tolerances or orientation errors. The linear error along the Z-axis is equal to the error in the Z-axis actuation only.
4. It is compact due symmetricity and its small foot-print area, leading to minimization of the system's dimensions that reduces thermal and geometric errors.
5. It has a pneumatic counterbalance in each of the prismatic joints to ensure the compensation of gravity with high load to weight ratio, quick settling and protection from sudden power off situation.
6. Abbe error free design due to the position of the three plane mirrors used for further kinematic calibration with laser beam interferometers.
7. The motor cables, encoder signal cables and pipes for air flow to linear air bearings and pneumatic counterbalance are stationary due to its unique design. Therefore, complex cable management system is not required for its operation.
8. The design of the system is completely modular, so that any part can be repaired or serviced with very ease in disassembly or assembly, as per requirement.

What is claimed is:

1. A three degrees of freedom (3DoFs) precision positioning Wedge Air Bearing Stage System (WABSS), comprising a movable central stage assembly (CSA) connected to a stationary base platform (BP) via three slide bar assemblies (SBAs) corresponding three carriage assemblies (CAs) and a vertical carriage column (CC), where the CSA can translate along three axes for precision positioning by controlled and coordinated motion of the three SBAs via parallel kinematic principles, when a linear air bearing based active prismatic joint ($T_i$, ∀i=1,2,3), and a flat pad air bearing based planar joint ($P_i$, ∀i=1,2,3) are provided in each kinematic sub-chain, ($M_i$, ∀i=1,2,3) such that linear actuation is provided through an ironless linear motor at each prismatic joint ($T_i$, ∀i=1,2,3) to make cogging free frictionless translations of slide bars along a Z-axis within corresponding CA; the linear actuation is controlled via position feedback obtained from an optical linear encoder with reading head and optical scale, such that the planar joints ($P_i$, ∀i=1,2,3) can maintain a stiffness in the presence of a magnetic preloading at each of the flat pad air bearing based planar joints; a pneumatic counterbalance attached to each prismatic joint ($T_i$, ∀i=1,2,3) can maintain quick settling as well as gravity compensation for achieving high precision and fault tolerant in sudden power off situation, in addition to provision for further enhancement of precision via three plane mirrors attached to the CSA with the help of mirror brackets and mounts, so that the Abbe error-free measurement, which is is followed along the three directions of translations, and a vertical topological design of the WABSS are responsible for independence of linear geometric error along the Z-axis from angular tolerances and a relatively small footprint of the system, to achieve smaller thermal and geometric errors.

2. The 3DoFs WABSS as claimed in claim 1, wherein three prismatic joints are formed between the corresponding CAs and the SBAs; and three flat pad air bearing based planar joints are formed between the corresponding SBAs and three stainless-steel plates, respectively, where one prismatic joint and one flat pad air bearing based planar joint are present in each kinematic sub-chain ($M_i$, ∀i=1,2,3).

3. The 3DoFs WABSS as claimed in claim 2, wherein each of the prismatic joints is actuated for coordinated and cogging free translation of the SBA via iron-less linear motor, having magnetic track and stationary motor coil, by following the kinematic principle and are further responsible for the translations of CSA along the X-, Y- and Z-axis directions via three planar joints to achieve precision positioning.

4. The 3DoFs WABSS as claimed in claim 2, wherein each of the prismatic joints has a modular and detachable linear aerostatic bearing consisting of four aerostatic bearing plates with nozzles to facilitate pressurized air flow, where the plates are connected with a first aerostatic bearing plate and a third aerostatic bearing plate, at two ends via screws, and subsequently, the first aerostatic bearing plate is connected with a corresponding side wall of a stationary vertical CC via screws for obtaining a frictionless motion between a stationary CA and a translating SBA.

5. The 3DoFs WABSS as claimed in claim 3, wherein each of the three planar joints is a flat pad air bearing with a flat pad air bearing plate and preloading via permanent magnets to maintain the required stiffness at a joint for frictionless motion between a bearing surface of each of the stainless-steel plates of CSA and a flat surface of the corresponding bearing plate flat pad air bearing plate of the respective SBA.

6. The 3DoFs WABSS as claimed in claim 1, wherein following the kinematic principle, input translational motion is provided by a translatable magnetic track that is through energizing of a stationary motor coil with a required amount of current, in the corresponding SBA in each of the prismatic joints so that a respective motion is tracked by the optical linear encoder, for feedback to a motion control loop, whose reading head is mounted on a left linear air bearing plate of the stationary CA via a mounting plate.

7. The 3DoFs WABSS as claimed in claim 1, wherein a pneumatic counterbalance, having a stationary cylinder through which the air flows, is mounted on the corresponding CA with the help of a mounting plate and a piston mounted on the corresponding SBA with the help of a mounting plate, is provided with each of the prismatic joints for compensation of gravity force, so as to increase load to weight ratio, for quick settling and also to protect the system from sudden power off situations.

8. The 3DoFs WABSS as claimed in claim 1, wherein geometric translational error along the Z-axis is independent of the angular tolerances and amount of translation along the Z-axis.

9. The 3DoFs WABSS as claimed in claim 1, wherein the three plane mirrors provide the Abbe error free measurement of the position of the CSA along three axes (X-, Y- and Z-axis), respectively, using three laser interferometers.

* * * * *